United States Patent
Okuno

(10) Patent No.: US 8,816,354 B2
(45) Date of Patent: Aug. 26, 2014

(54) GROUP III NITRIDE SEMICONDUCTOR LIGHT-EMITTING DEVICE AND PRODUCTION METHOD THEREFOR

(71) Applicant: Toyoda Gosei Co., Ltd., Kiyosu (JP)

(72) Inventor: Koji Okuno, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/921,094

(22) Filed: Jun. 18, 2013

(65) Prior Publication Data

US 2013/0341636 A1    Dec. 26, 2013

(30) Foreign Application Priority Data

Jun. 21, 2012 (JP) ................................. 2012-139602

(51) Int. Cl.
   *H01L 21/02* (2006.01)

(52) U.S. Cl.
   USPC .................. 257/76; 257/13; 257/91; 257/94; 257/96

(58) Field of Classification Search
   CPC .............. H01L 21/02458; H01L 21/0254; H01L 33/007; H01L 29/2003; H01L 33/32
   USPC .......... 257/13, 79–87, 91, 94, 96, 97, 99, 103
   See application file for complete search history.

(56) References Cited

U.S. PATENT DOCUMENTS

| 7,250,633 | B2 * | 7/2007 | Seo et al. .................. 257/82 |
| 7,998,771 | B2 | 8/2011 | Bae |
| 2006/0054921 | A1 * | 3/2006 | Murakami et al. ........... 257/103 |
| 2010/0240162 | A1 | 9/2010 | Bae |
| 2011/0147763 | A1 * | 6/2011 | Hanawa et al. ............. 257/76 |
| 2012/0097922 | A1 * | 4/2012 | Masuya et al. ............. 257/13 |
| 2013/0082295 | A1 * | 4/2013 | Yoshida ................... 257/98 |

FOREIGN PATENT DOCUMENTS

| JP | 2006/313888 A | 11/2006 |
| JP | 2007/103712 A | 4/2007 |
| JP | 2008/47864 | 2/2008 |
| JP | 2010-512017 A | 4/2010 |
| WO | WO 2008/069482 A1 | 6/2008 |

* cited by examiner

*Primary Examiner* — Steven Loke
*Assistant Examiner* — Didarul Mazumder
(74) *Attorney, Agent, or Firm* — McGinn IP Law Group, PLLC

(57) ABSTRACT

The present invention provides a Group III nitride semiconductor light-emitting device exhibiting improved light extraction efficiency. An AlGaN semiconductor layer is formed in contact with and on a p-GaN p-contact layer, and an ITO transparent electrode is formed in contact with and on the semiconductor layer. The semiconductor layer comprises AlGaN having an Al composition ratio of 10 mol % to 50 mol %, and has a thickness of 2 Å to 50 Å. The semiconductor layer has a refractive index at an emission wavelength lower than that of the p-contact layer, and larger than that of the transparent electrode. By forming such a semiconductor layer, the reflection is suppressed between the p-contact layer and the transparent electrode, thereby improving the light extraction efficiency.

20 Claims, 3 Drawing Sheets

GROUP III NITRIDE SEMICONDUCTOR LIGHT-EMITTING DEVICE AND PRODUCTION METHOD THEREFOR

BACKGROUND OF THE INVENTION

1. Field of the Invention

The present invention relates to a Group III nitride semiconductor light-emitting device exhibiting improved light extraction efficiency and the production method therefore.

2. Background Art

The Group III nitride semiconductor light-emitting device has been used as a light source for emitting white light, and particularly the demand for illumination or display backlight is increasing.

The Group III nitride semiconductor light-emitting device generally has a structure in which an ITO transparent electrode is formed on a p-contact layer to diffuse current. Patent Document 1 discloses that p-GaN/p-AlGaN may be used as the p-contact layer. However, there is no mention about the reason for forming a p-AlGaN layer.

Patent Documents 2 and 3 disclose a structure in which p-AlGaN/GaN/p$^+$-AlGaN is repeatedly deposited on a p-contact layer of p-GaN. This is to improve the current diffusion efficiency in the main surface direction of the device by using two-dimensional electron gas generated at the interface between GaN and AlGaN.

Patent Document 1: Japanese Patent Application Laid-Open (kokai) No. 2008-47864
Patent Document 2: Japanese Patent Application Laid-Open (kokai) No. 2006-313888
Patent Document 3: Japanese Unexamined Patent Application Publication (Translation of PCT Application) No. 2010-512017

A high output Group III nitride semiconductor light-emitting device is demanded in illumination applications. However, there is a problem that the Group III nitride semiconductor light-emitting device has poor light extraction efficiency. One of the causes for the deterioration of the light extraction efficiency is the reflection at the interface between the p-contact layer and the transparent electrode. When the p-contact layer comprises p-GaN, and the transparent electrode comprises ITO, the p-contact layer has a refractive index for blue light of about 2.3, and the transparent electrode has a refractive index for blue light of about 1.9, thus the refractive indices are quite different. Therefore, a part of the light emitted from the light-emitting layer cannot be extracted from the device because the light is totally reflected at the interface between the p-contact layer and the transparent electrode.

Patent Documents 1 to 3 do not describe a problem of the above reflection at the interface between the p-contact layer and the transparent electrode.

SUMMARY OF THE INVENTION

In view of the foregoing, an object of the present invention is to provide a Group III nitride semiconductor light-emitting device exhibiting improved light extraction efficiency by suppressing reflection between the p-contact layer and the transparent electrode. Another object of the present invention is to provide a method for producing the Group III nitride semiconductor light-emitting device.

In a first aspect of the present invention, there is provided a Group III nitride semiconductor light-emitting device having a transparent electrode formed of a material having a refractive index at the emission wavelength lower than that of the p-contact layer on the p-contact layer, wherein a semiconductor layer is formed of an Al contained Group III nitride semiconductor having a refractive index at the emission wavelength lower than that of the p-contact layer and higher than that of the transparent electrode, in contact with and between the p-contact layer and the transparent electrode, the semiconductor layer has an Al composition ratio of 10 mol % to 50 mol % to the number of moles of the total Group III atoms, and a thickness of 2 Å to 50 Å.

The semiconductor layer may be formed of any Group III nitride semiconductor as long as it has an Al composition ratio of 10 mol % to 50 mol %, and a refractive index at the emission wavelength is lower than that of the p-contact layer and higher than that of the transparent electrode (hereinafter, the refractive index is at the emission wavelength unless otherwise specified). In the Group III nitride semiconductor, the higher the Al composition ratio, the lower the refractive index, and the higher the In composition ratio, the higher the refractive index. Therefore, the refractive index can be controlled by adjusting the composition ratio of the Group III metal. AlGaN is particularly preferably used. Since the Group III metals of AlGaN are Al and Ga, the composition ratio is easily adjusted, thereby the refractive index is easily controlled. The Al composition ratio is expressed as a ratio of the number of moles of Al to the total number of moles of the Group III metal of the Group III nitride semiconductor (mol %, hereinafter referred to as %). That is, in the Group III nitride semiconductor represented by the chemical formula $Al_xGa_yIn_zN$ ($x+y+z=1$, $0 \le x, y, z \le 1$), $x*100(\%)$ is the Al composition ratio. When the Al composition ratio is higher than 50%, the resistance of the semiconductor layer is higher, resulting in an increase in the drive voltage, which is not preferable. When the Al composition ratio is less than 10%, there is a little difference in the refractive index between the semiconductor layer and the p-contact layer, resulting in reducing the effect of suppressing the reflection between the p-contact layer 16 and the transparent electrode 19, which is not preferable.

The semiconductor layer may be formed so that the refractive index is gradually and continuously decreased from the p-contact layer side toward the transparent electrode side by changing the Al composition ratio in a thickness direction. In this case, the Al composition ratio of the present invention means an average Al composition ratio in the thickness direction. The Al composition ratio of the semiconductor layer falls within a range of preferably, 10% to 40%, and more preferably, 20% to 35%. A difference in the refractive index between the p-contact layer and the semiconductor layer is preferably 0.05 to 0.2, and a difference in the refractive index between the semiconductor layer and the transparent electrode is preferably 0.15 to 0.4. When the difference in the refractive index falls within such a range, the reflection between the p-contact layer and the transparent electrode is further suppressed, thereby further improving the light extraction efficiency.

The semiconductor layer has preferably a thickness of one molecular layer to 50 Å. When the thickness is larger than 50 Å, the drive voltage is increased due to the high resistivity of the semiconductor layer. It is not preferable that there are some portions where the semiconductor layer is not formed on the p-contact layer because the effect of suppressing the reflection between the p-contact layer and the transparent electrode is not obtained. More preferably, the thickness of the semiconductor layer is 5 Å to 25 Å. The thickness of the semiconductor layer may be either constant or not constant. The surface on the transparent electrode side of the semiconductor layer may have a concave and convex structure. By the formation of such structure, the light extraction efficiency can be further improved. When the thickness of the semiconductor layer is not constant, the thickness of the present invention means the average thickness.

The semiconductor layer may be doped with Mg. Mg doping can reduce the contact resistance to the transparent electrode, thereby suppressing an increase in the drive voltage. The Mg concentration of the semiconductor layer is, preferably, $1\times10^{20}/cm^3$ to $1\times10^{21}/cm^3$, more preferably, $2\times10^{20}/cm^3$ to $1\times10^{21}/cm^3$, and further preferably, $3\times10^{20}/cm^3$ to $5\times10^{20}/cm^3$.

The p-contact layer may be formed of any Group III nitride semiconductor such as Mg-doped GaN, AlGaN and InGaN having a refractive index at the emission wavelength higher than that of the semiconductor layer, and may comprise a single layer or a plurality of layers having different Mg concentrations or composition ratios. When the p-contact layer is formed of AlGaN, the Al composition ratio is preferably 5% or less. When the Al composition ratio is larger than 5%, the crystallinity of the p-contact layer is deteriorated or the resistivity is increased, resulting in an increase in the drive voltage. The light extraction efficiency may be improved by forming a concave and convex structure on the surface (on the semiconductor layer side) of the p-contact layer.

The transparent electrode may be formed of any material having a refractive index at the emission wavelength lower than that of the semiconductor layer. A transparent conductive oxide material such as ITO (indium tin oxide), IZO (indium zinc-doped oxide), ZnO, ICO (indium cerium-doped oxide), and a metal thin film such as Co/Au and Au may be used.

When the p-contact layer comprises a plurality of layers, high or low of the refractive index in the present invention means high or low for the layer in directly contact with the semiconductor layer. The same is applied to the transparent electrode.

The Group III nitride semiconductor light-emitting device has preferably an emission wavelength of 400 nm to 500 nm. When the emission wavelength falls within a range of 400 nm to 500 nm, the effect of reducing the reflection between the p-contact layer and the transparent electrode of the present invention is sufficiently exhibited.

A second aspect of the present invention is drawn to a specific embodiment of the Group III nitride semiconductor light-emitting device according to the first aspect, wherein the semiconductor layer has a thickness of 5 Å to 25 Å.

A third aspect of the present invention is drawn to a specific embodiment of the Group III nitride semiconductor light-emitting device according to the first or second aspect, wherein the semiconductor layer has an Al composition ratio of 10% to 40%.

A fourth aspect of the present invention is drawn to a specific embodiment of the Group III nitride semiconductor light-emitting device according to the first to third aspects, wherein a difference in the refractive index between the p-contact layer and the semiconductor layer is 0.05 to 0.2, and a difference in the refractive index between the semiconductor layer and the transparent electrode is 0.15 to 0.4.

A fifth aspect of the present invention is drawn to a specific embodiment of the Group III nitride semiconductor light-emitting device according to the first to fourth aspects, wherein the semiconductor layer has a concave and convex structure on the surface on the transparent electrode side thereof.

A sixth aspect of the present invention is drawn to a specific embodiment of the Group III nitride semiconductor light-emitting device according to the first to fifth aspects, wherein the semiconductor layer is doped with Mg, and its Mg concentration is $1\times10^{20}/cm^3$ to $1\times10^{21}/cm^3$.

A seventh aspect of the present invention is drawn to a specific embodiment of the Group III nitride semiconductor light-emitting device according to the first to sixth aspects, wherein the semiconductor layer comprises AlGaN.

An eight aspect of the present invention is drawn to a specific embodiment of the Group III nitride semiconductor light-emitting device according to the first to seventh aspects, wherein the p-contact layer comprises GaN.

A ninth aspect of the present invention is drawn to a specific embodiment of the Group III nitride semiconductor light-emitting device according to the first to eighth aspects, wherein the p-contact layer comprises AlGaN having an Al composition ratio of 5% or less.

A tenth aspect of the present invention is drawn to a specific embodiment of the Group III nitride semiconductor light-emitting device according to the first to ninth aspects, wherein the transparent electrode comprises ITO.

An eleventh aspect of the present invention is drawn to a specific embodiment of the Group III nitride semiconductor light-emitting device according to the first to tenth aspects, wherein the emission wavelength is 400 nm to 500 nm.

In a twelfth aspect of the present invention, there is provided a method for producing the Group III nitride semiconductor light-emitting device having a transparent electrode formed of a material having a refractive index at the emission wavelength lower than that of the p-contact layer on the p-contact layer, wherein after forming the p-contact layer, a semiconductor layer made of any Al contained Group III nitride semiconductor having a refractive index at the emission wavelength lower than that of the p-contact layer and higher than that of the transparent electrode is formed in contact with and on the p-contact layer at a growth temperature of 1,000° C. or less so as to have an Al composition ratio of 10% to 50% and a thickness of one molecular layer to 50 Å, and thereafter, a transparent electrode is formed in contact with and on the semiconductor layer.

The semiconductor layer is grown at a temperature of preferably, 900° C. or less, and more preferably, 800° C. or less. By lowering the growth temperature, a concave and convex structure can be formed on the surface of the semiconductor layer, thereby improving the light extraction efficiency. The lower limit of the growth temperature is the temperature at which the semiconductor layer is crystal grown. The method for forming a concave and convex structure on the surface of the semiconductor layer includes excessively doping with impurities such as Mg (e.g. $1\times10^{21}/cm^3$ or more) as well as lowering the growth temperature.

An thirteenth aspect of the present invention is drawn to a specific embodiment of the method for producing the Group III nitride semiconductor light-emitting device according to the twelfth aspect, wherein a concave and convex structure is formed on the surface on the transparent electrode side of the semiconductor layer by lowering the growth temperature of the semiconductor layer to 800° C. or less.

By forming the semiconductor layer between the p-contact layer and the transparent electrode as in the present invention, the reflection is reduced between the p-contact layer and the transparent electrode. Therefore, according to the present invention, the light extraction efficiency of the Group III nitride semiconductor light-emitting device can be improved.

By forming the concave and convex structure on the surface on the transparent electrode side of the semiconductor layer, the light extraction efficiency can be further improved.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described with reference to the drawings. However, the present invention is not limited to the embodiment.

Embodiment 1

Figure 1:
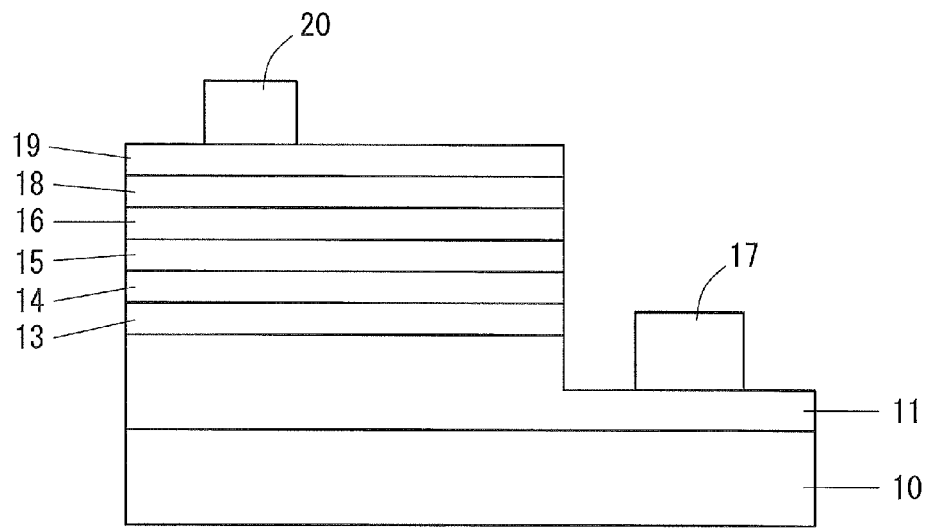
FIG. 1 shows the configuration of a light-emitting device according to Embodiment 1.

FIG. 1 shows the configuration of a light-emitting device according to Embodiment 1. As shown in FIG. 1, the light-emitting device according to Embodiment 1 includes a sapphire substrate 10; and an n-contact layer 11, an n-cladding layer 13, a light-emitting layer 14, a p-cladding layer 15, a p-contact layer 16, and a semiconductor layer 18, each of the layers being formed of Group III nitride semiconductor, are sequentially deposited on the sapphire substrate 10 via an AlN buffer layer (not illustrated). A trench having a depth extending from the top surface of the semiconductor layer 18 to the n-contact layer 11, and the re-contact layer 11 is exposed at the bottom of the trench. An n-electrode 17 is formed on the surface of the n-contact layer 11 exposed at the bottom of the trench. An ITO transparent electrode 19 is formed on the semiconductor layer 18, and a p-electrode 20 is formed on the transparent electrode 19. The light-emitting device according to Embodiment 1 is of a face-up type in which light is extracted from the surface on the p-electrode 20 side.

Next will be described the detailed structure of the light-emitting device according to Embodiment 1.

The sapphire substrate 10 has a periodic concave and convex structure such as a stripe pattern or a dot pattern (not illustrated) on the surface on the side where a Group III nitride semiconductor is crystal grown. This concave and convex structure is provided to improve the light extraction efficiency. The growth substrate may be formed of, for example, SiC, Si, ZnO, spinel, GaN or $Ga_2O_3$ other than sapphire.

The n-contact layer 11 is formed of n-GaN having a Si concentration of $1 \times 10^{18}/cm^3$ of more. The n-contact layer 11 may comprise a plurality of layers having different Si concentrations. When some of the layers have higher Si concentrations and are in contact with the n-electrode 17, the contact resistance with the n-electrode 17 can be further reduced without deteriorating the crystallinity of the n-contact layer 11.

The n-cladding layer 13 has a superlattice structure formed of fifteen layer units repeatedly deposited, each layer unit including three layers of undoped InGaN, undoped GaN, and n-GaN sequentially deposited.

An ESD layer may be formed between the n-contact layer 11 and the n-cladding layer 13 to increase the breakdown voltage. The ESD layer comprises, for example, two layers formed of undoped GaN having a thickness of 312.5 nm, and n-GaN having a Si concentration of $5 \times 10^{18}/cm^3$ to $9 \times 10^{18}/cm^3$ and a thickness of 30 nm, which are deposited in this order on the n-contact layer 11.

The light-emitting layer 14 has a MQW structure in which a well layer of undoped InGaN and a barrier layer of undoped AlGaN are alternately and repeatedly deposited. A capping layer may be formed between the well layer and the barrier layer, which comprises AlGaN having an Al composition ratio equal to or lower than that of the barrier layer, and is grown at the same temperature as in the well layer. Since such a capping layer prevents In from evaporating from the well layer during heating for formation of the barrier layer, the light emission efficiency can be improved. A layer of undoped GaN and undoped AlGaN may be formed between the light-emitting layer 14 and the p-cladding layer 15 to prevent Mg from diffusing from the p-cladding layer 15 to the light-emitting layer 14.

The p-cladding layer 15 has a superlattice structure formed by repeatedly depositing layer units, each layer unit comprising a p-AlGaN layer and a p-InGaN layer. However, the initial layer of the p-cladding layer 15, which is in contact with the light-emitting layer 14, is the p-InGaN layer, and the final layer of the p-cladding layer 15, which is in contact with the p-contact layer 16, is the p-AlGaN layer. The p-cladding layer 15 may have a superlattice structure other than the above, or a structure other than the superlattice structure. For example, it may comprise a single layer of p-AlGaN, or a plurality of layers having a structure other than the superlattice structure.

The p-contact layer 16 comprises a single layer formed of p-GaN. It may be formed of AlGaN, InGaN or AlGaInN other than GaN as long as it is a Group III nitride semiconductor having a higher refractive index than that of the semiconductor layer 18. When AlGaN is used for the p-contact layer 16, the Al composition ratio is preferably 5% or less. Moreover, the p-contact layer 16 may comprise a plurality of layers having different Mg concentrations or composition ratios as long as the layer being in contact with the semiconductor layer 18, which is one layer of a plurality of layers constituting the p-contact layer 16, has a higher refractive index than that of the semiconductor layer 18. A concave and convex structure may be formed on the surface on the semiconductor layer 18 side of the p-contact layer 16 to improve the light extraction efficiency.

The semiconductor layer 18 comprises AlGaN having an Al composition ratio of 10% to 50%, and has a thickness of 2 Å to 50 Å. The semiconductor layer 18 has a refractive index at the emission wavelength lower than that of the p-contact layer 16 and higher than that of the transparent electrode 19. The semiconductor layer 18 is formed in a flat film on almost the entire top surface of the p-contact layer 16, one surface of the semiconductor layer 18 is in contact with the p-contact layer 16, and the other surface is in contact with the transparent electrode 19. By the introduction of such semiconductor layer 18 between the p-contact layer 16 and the transparent electrode 19, the refractive index gradually changes from the p-contact layer 16 toward the transparent electrode 19. The reflection is suppressed between the p-contact layer 16 and the transparent electrode 19, thereby improving the light extraction efficiency.

The semiconductor layer 18 may be formed of a Group III nitride semiconductor having any composition ratio including Al other than AlGaN. The higher the Al composition ratio of the Group III nitride semiconductor, the lower the refractive index. The higher the In composition ratio, the higher the refractive index. Therefore, the refractive index of the semiconductor layer 18 can be adjusted within the above range by controlling the composition ratio of the Group III metal. Preferably, the semiconductor layer 18 is formed of AlGaN as in Embodiment 1. Since AlGaN is a ternary compound, it is easier to control the composition ratio compared to a quaternary compound semiconductor, and thus makes it easier to control the refractive index.

The semiconductor layer 18 has an Al composition ratio of 10% to 50% because when the Al composition ratio is 50% or more, the resistance of the semiconductor layer 18 is higher, resulting in an increase in the drive voltage, and when the Al composition ratio is less than 10%, there is a little difference in the refractive index between the semiconductor layer 18 and the p-contact layer 16, resulting in reducing the effect of suppressing reflection between the p-contact layer 16 and the transparent electrode 19. The Al composition ratio of the semiconductor layer 18 falls within a range of more preferably, 10% to 40%, and further preferably, 20% to 35%.

Preferably, a difference in the refractive index between the p-contact layer 16 and the semiconductor layer 18 is 0.05 to 0.2, and a difference in the refractive index between the semiconductor layer 18 and the transparent electrode 19 is 0.15 to 0.4. When the difference of the refractive index falls within such a range, reflection is more suppressed between the p-contact layer 16 and the transparent electrode 19, and the light extraction efficiency is further improved.

The semiconductor layer 18 may be formed so that the refractive index is gradually and continuously decreased from the p-contact layer side toward the transparent electrode side. Such change in the refractive index can be achieved, for example, by changing the Al composition ratio in a thickness direction. When the refractive index of the semiconductor layer 18 is not constant, the average Al composition ratio in a thickness direction is preferably 10% to 50%.

The semiconductor layer 18 has a thickness of one molecular layer to 50 Å for the following reasons. When the semiconductor layer 18 has a thickness of less than one molecular layer, that is, the semiconductor layer 18 is not formed, there is a big difference in the refractive index between the p-contact layer 16 and the transparent electrode 19, and the light extraction efficiency is low. When the semiconductor layer 18 has a thickness of 50 Å or more, the number of electrons tunneling through the semiconductor layer 18 is reduced, the resistance of the semiconductor layer 18 is higher, resulting in an increase in the drive voltage. For the above reasons, the semiconductor layer 18 has a thickness of one molecular layer to 50 Å. The semiconductor layer 18 is preferably formed on almost the entire top surface of the p-contact layer 16. As long as it is formed so as to cover the entire top surface, the thickness may not be constant. When the thickness is not constant, the average thickness is preferably one molecular layer to 50 Å. When the semiconductor layer 18 is formed in a dot-like, mesh-like or island-like pattern, there are some portions where the p-contact layer 16 is in direct contact with the transparent electrode 19, and there is no effect of reducing the reflection by the semiconductor layer 18. Therefore, the effect of improving the light extraction efficiency is small, which is not preferable. The semiconductor layer 18 more preferably has a thickness of 5 Å to 25 Å.

The semiconductor layer 18 may be undoped, however it is preferably doped with Mg to reduce the contact resistance with the transparent electrode 19. The Mg concentration is preferably $1 \times 10^{20}/cm^3$ to $1 \times 10^{21}/cm^3$, more preferably $2 \times 10^{20}/cm^3$ to $1 \times 10^{21}/cm^3$, and further preferably $3 \times 10^{20}/cm^3$ to $5 \times 10^{20}/cm^3$.

The transparent electrode 19 comprises ITO, and is formed on almost the entire surface of the semiconductor layer 18. The transparent electrode 19 may be formed of a material having a refractive index lower than that of the semiconductor layer 18. Transparent conductive oxide material such as ICO (indium cerium-doped oxide), IZO (indium zinc-doped oxide), ZnO, $TiO_2$, $NbTiO_2$, $TaTiO_2$, metal thin film such as Co/Au and Au, and graphene other than ITO may be used.

The n-electrode 17 and the p-electrode 20 may have a structure comprising a pad to which a wire is bonded, and a wiring which extends (e.g. in a grid-like pattern, a comb teeth pattern, or a radial pattern) on each surface thereof and is connected to the pad. Such structure allows improving the current diffusion, thereby achieving even light emission.

As described above, in the light-emitting device according to Embodiment 1, the semiconductor layer 18 is formed between the p-contact layer 16 and the transparent electrode 19, which satisfies the above refractive index, Al composition ratio, and the thickness. This allows effective suppression of the reflection conventionally generated at the interface between the p-contact layer 16 and the transparent electrode 19. Therefore, the light-emitting device according to Embodiment 1 exhibits improved light extraction efficiency compared to the conventional light-emitting device.

The light-emitting device according to Embodiment 1 has an emission wavelength of preferably 380 nm to 600 nm, and more preferably 400 nm to 500 nm. When the emission wavelength falls within a range of 400 nm to 500 nm, the reflection between the p-contact layer 16 and the transparent electrode 19 can be effectively suppressed.

Next will be described processes for producing the light-emitting device according to Embodiment 1 with reference to FIGS.

Figure 2A:
FIGS. 2A-2B are sketches showing processes for producing the light-emitting device according to Embodiment 1.

Firstly, a sapphire substrate 10 having a concave and convex structure was prepared. Thermal cleaning was performed in a hydrogen atmosphere to remove impurities from the surface of the sapphire substrate 10 (FIG. 2A).

Figure 2B:
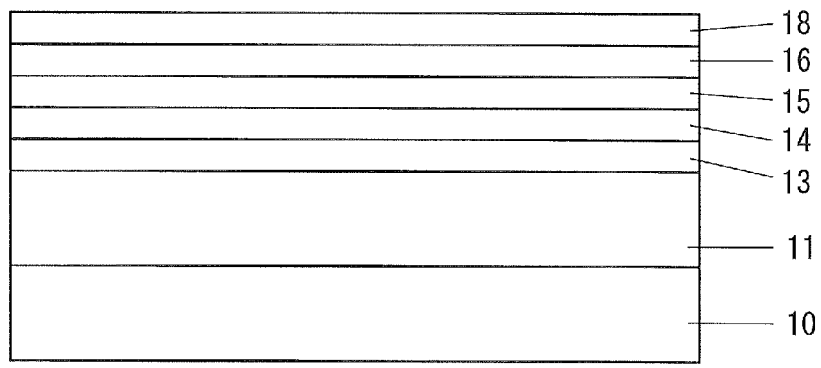

Subsequently, an AlN buffer layer (not illustrated), an n-contact layer 11, an ESD layer 12, an n-cladding layer 13, a light-emitting layer 14, a p-cladding layer 15, a p-contact layer 16, and a semiconductor layer 18 are sequentially deposited on the sapphire substrate 10 by MOCVD (FIG. 2B). The raw material gases employed for MOCVD were as follows: ammonia ($NH_3$) as a nitrogen source; trimethylgallium ($Ga(CH_3)_3$) as a Ga source; trimethylindium ($In(CH_3)_3$) as an In source; trimethylaluminum ($Al(CH_3)_3$) as an Al source; silane ($SiH_4$) as an n-type doping gas; cyclopentadienylmagnesium ($Mg(C_5H_5)_2$) as a p-type doping gas, and hydrogen ($H_2$) or nitrogen ($N_2$) as a carrier gas.

Here, the growth temperature of the semiconductor layer 18 is adjusted to 1,000° C. or less so that the semiconductor layer 18 is formed in a film on the entire top surface of the p-contact layer 16. The supply amount of raw material gases or the growth time are adjusted so that the semiconductor layer 18 has an Al composition ratio of 10% to 50% and a thickness of 2 Å to 50 Å.

Next, a trench with a depth extending from the surface of the semiconductor layer 18 to the n-contact layer 11 was formed by dry etching a portion of the semiconductor layer 18. Then, an ITO transparent electrode 19 was formed on almost the entire top surface of the semiconductor layer 18. A p-electrode 20 was formed on the transparent electrode 19, and an n-electrode 17 was formed on the n-contact layer 11 exposed at the bottom of the trench. Through the above, the Group III nitride semiconductor light-emitting device according to Embodiment 1 as shown in FIG. 1 was produced.

Figure 3:
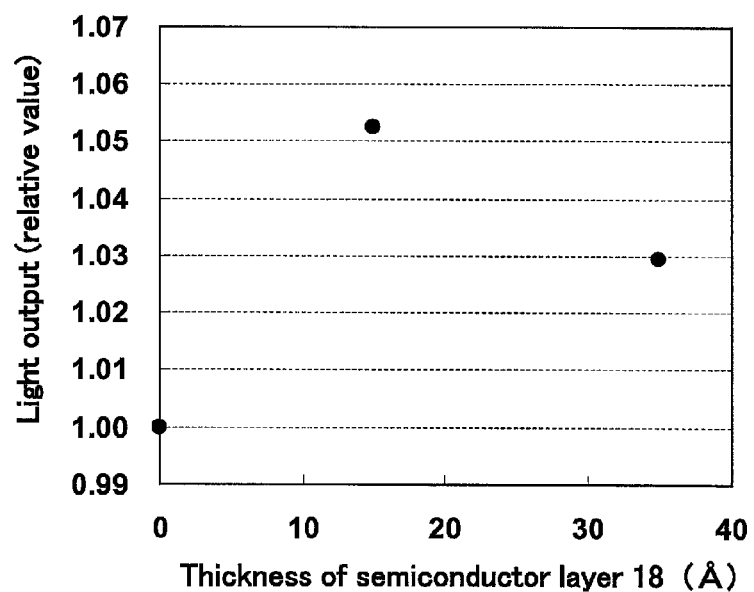
FIG. 3 is a graph showing a relationship between the thickness of semiconductor layer 18 and the light output.

FIG. 3 is a graph showing a relationship between the thickness of the semiconductor layer 18 and the light output. The light outputs are when the thickness of the semiconductor layer 18 formed of AlGaN having an Al composition ratio of 30% is 0 Å (that is, a semiconductor layer 18 is not formed), 15 Å, and 35 Å. The light output is shown as a relative value with the light output when a semiconductor layer 18 is not formed set to 1. The emission wavelength is 450 nm. The refractive index at the emission wavelength is about 2.3 for the p-contact layer 16 formed of p-GaN, about 2.2 for the semiconductor layer 18 formed of AlGaN having an Al composition ratio of 30%, and about 1.9 for the ITO transparent electrode 19. As is clear from FIG. 3, the light output is increased in both cases when the semiconductor layer 18 has a thickness of 15 Å and 35 Å compared to the case when the semiconductor layer 18 is not formed. This is probably because the introduction of the semiconductor layer 18 suppresses the reflection between the p-contact layer 16 and the transparent electrode 19, thereby improving the light extraction efficiency.

Figure 4:
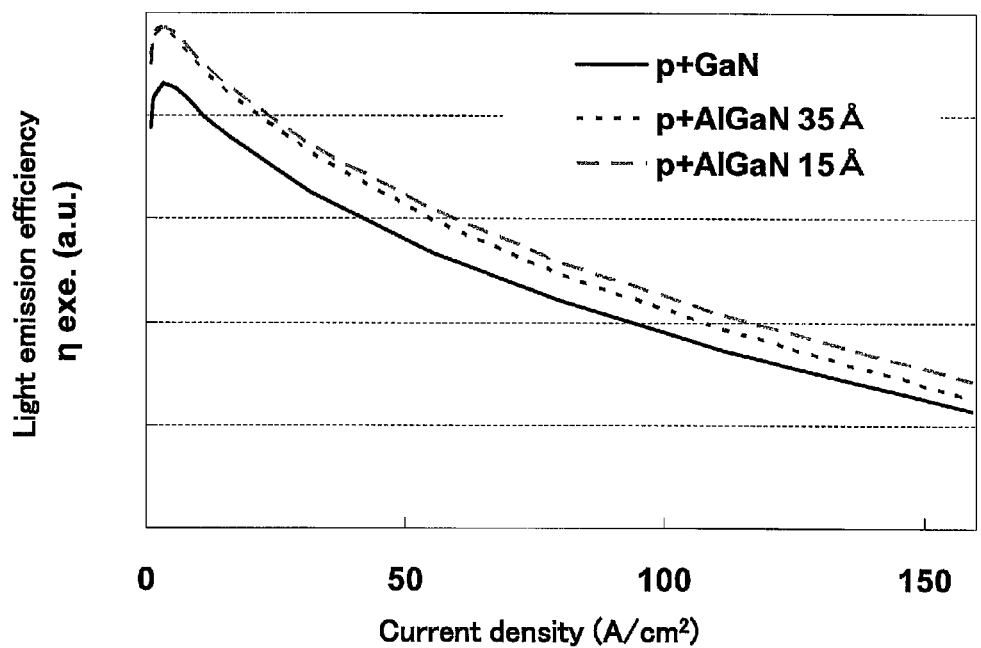
FIG. 4 is a graph showing a relationship between the current density and the light emission efficiency.

FIG. 4 is a graph showing a relationship between the current density and the light emission efficiency. Similarly as FIG. 3, the cases when the thickness of the semiconductor layer 18 formed of AlGaN having an Al composition ratio of 30% is 0 Å, 15 Å, and 35 Å are shown. As is clear from FIG. 4, when a semiconductor layer 18 is not formed, the light emission efficiency decreases as the current density increases. Even in the cases when the thickness of the semiconductor layer 18 is 15 Å and 35 Å, a similar curve is drawn, and the emission performance decreases as the current density increases. However, the light emission efficiency is higher at any current density when the semiconductor layer 18 has a thickness of 15 Å and 35 Å than when a semiconductor layer 18 is not formed.

Moreover, as is clear from FIGS. 3 and 4, the light emission efficiency is higher and the light output is higher when the thickness of the semiconductor layer 18 is 15 Å than when the thickness is 35 Å. This is probably because the number of electrons which are tunneling through the semiconductor layer 18 is increased by reducing the thickness of the semiconductor layer 18, resulting in a decrease in the contact resistance to the transparent electrode 19 or the resistance of the semiconductor layer 18 itself.

Embodiment 2

Figure 5:
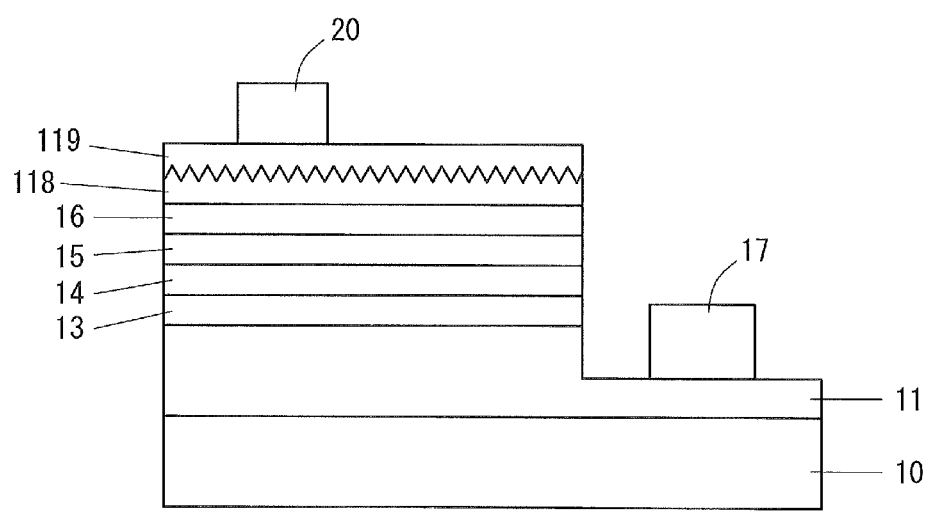
FIG. 5 shows the configuration of a light-emitting device according to Embodiment 2.

FIG. 5 shows the configuration of a light-emitting device according to Embodiment 2. The light-emitting device according to Embodiment 2 has the same structure as that of the light-emitting device according to Embodiment 1, except that the semiconductor layer 18 and the transparent electrode 19 are changed to the semiconductor layer 118 and the transparent electrode 119 described below.

The semiconductor layer 118 is formed in a film having a concave and convex structure on the surface on the transparent electrode 119 side. Except that, it has the same refractive index, thickness, material, and Al composition ratio as that of the semiconductor layer 18 according to Embodiment 1. The average thickness of the semiconductor layer 118 falls within the same range as the semiconductor layer 18. The transparent electrode 119 is formed so as to fill in the concave and convex structure on the semiconductor layer 118. The material and the refractive index of the transparent electrode 119 are the same as the transparent electrode 19.

Such concave and convex structure is formed by adjusting the growth temperature to 900° C. or less when forming the semiconductor layer 18 in the process for producing a light-emitting device according to Embodiment 1 or by being excessively doped with impurities such as Mg (e.g. $1 \times 10^{21}/$ cm$^3$ or more). The production process is the same as Embodiment 1 except for the above. The growth temperature is preferably 800° C. or less because the density or depth of the concave and convex structure is improved, thereby further improving the light extraction efficiency.

The light-emitting device according to Embodiment 2 exhibits improved light extraction efficiency because the reflection between the p-contact layer 16 and the transparent electrode 119 is suppressed similarly as the light-emitting device according to Embodiment 1. Moreover, the light extraction efficiency is further improved because a concave and convex structure is formed on the surface of the semiconductor layer 118.

The light-emitting device according to Embodiment 1 or 2 is of a face-up type. However, the present invention is not limited to this, and the present invention can be applied to a vertical type light-emitting device in which light is extracted from the p-electrode side, thereby improving the light extraction efficiency.

The present invention is characterized in the semiconductor layers 18 and 118 of the light-emitting device according to Embodiments 1 and 2. Any conventionally known structures and production methods may be employed for other configuration.

The Group III nitride semiconductor light-emitting device of the present invention can be employed in, for example, an illumination apparatus or a display apparatus.

What is claimed is:

1. A Group III nitride semiconductor light-emitting device having a transparent electrode made of a material having a refractive index at an emission wavelength lower than that of a p-contact layer on the p-contact layer, the Group III nitride semiconductor light-emitting device comprising:
   a semiconductor layer formed in contact with and between the p-contact layer and the transparent electrode and made of any Al contained Group III nitride semiconductor having a refractive index at the emission wavelength lower than that of the p-contact layer and larger than that of the transparent electrode; and
   wherein the semiconductor layer has an Al composition ratio of 10 mol % to 50 mol % to the number of moles of the total Group III atoms, and a thickness of one molecular layer to 50 Å.

2. The Group III nitride semiconductor light-emitting device according to claim 1, wherein the semiconductor layer has a thickness of 5 Å to 25 Å.

3. The Group III nitride semiconductor light-emitting device according to claim 1, wherein the Al composition ratio is 10 mol % to 40 mol % to the number of moles of the total Group III atoms.

4. The Group III nitride semiconductor light-emitting device according to claim 2, wherein the Al composition ratio is 10 mol % to 40 mol % to the number of moles of the total Group III atoms.

5. The Group III nitride semiconductor light-emitting device according to claim 1, wherein a difference in the refractive index between the p-contact layer and the semiconductor layer is 0.05 to 0.2, and a difference in the refractive index between the semiconductor layer and the transparent electrode is 0.15 to 0.4.

6. The Group III nitride semiconductor light-emitting device according to claim 2, wherein a difference in the refractive index between the p-contact layer and the semiconductor layer is 0.05 to 0.2, and a difference in the refractive index between the semiconductor layer and the transparent electrode is 0.15 to 0.4.

7. The Group III nitride semiconductor light-emitting device according to claim 3, wherein a difference in the refractive index between the p-contact layer and the semiconductor layer is 0.05 to 0.2, and a difference in the refractive index between the semiconductor layer and the transparent electrode is 0.15 to 0.4.

8. The Group III nitride semiconductor light-emitting device according to claim 4, wherein a difference in the refractive index between the p-contact layer and the semiconductor layer is 0.05 to 0.2, and a difference in the refractive index between the semiconductor layer and the transparent electrode is 0.15 to 0.4.

9. The Group III nitride semiconductor light-emitting device according to claim 1, wherein the semiconductor layer has a concave and convex structure on a surface on a transparent electrode side.

10. The Group III nitride semiconductor light-emitting device according to claim 1, wherein the semiconductor layer is doped with Mg, and its Mg concentration is $1 \times 10^{20}/cm^3$ to $1 \times 10^{21}/cm^3$.

11. The Group III nitride semiconductor light-emitting device according to claim 8, wherein the semiconductor layer is doped with Mg, and its Mg concentration is $1 \times 10^{20}/cm^3$ to $1 \times 10^{21}/cm^3$.

12. The Group III nitride semiconductor light-emitting device according to claim 1, wherein the semiconductor layer comprises AlGaN.

13. The Group III nitride semiconductor light-emitting device according to claim 8, wherein the semiconductor layer comprises AlGaN.

14. The Group III nitride semiconductor light-emitting device according to claim 1, wherein the p-contact layer comprises GaN.

15. The Group III nitride semiconductor light-emitting device according to claim 1, wherein the p-contact layer comprises AlGaN having an Al composition ratio of 5 mol % or less.

16. The Group III nitride semiconductor light-emitting device according to claim 1, wherein the transparent electrode comprises ITO.

17. The Group III nitride semiconductor light-emitting device according to claim 8, wherein the transparent electrode comprises ITO.

18. The Group III nitride semiconductor light-emitting device according to claim 1, wherein the emission wavelength is 400 nm to 500 nm.

19. A method for producing a Group III nitride semiconductor light-emitting device having a transparent electrode made of a material having a refractive index at an emission wavelength lower than that of a p-contact layer on the p-contact layer, the method comprising:

forming the p-contact layer;

forming a semiconductor layer in contact with and on the p-contact layer, made of any Al contained Group III nitride semiconductor having a refractive index at the emission wavelength lower than that of the p-contact layer and higher than that of the transparent electrode at a growth temperature of 1,000° C. or less so as to have an Al composition ratio of 10 mol % to 50 mol % to the number of moles of the total Group III atoms, and a thickness of one molecular layer to 50 Å; and forming the transparent electrode in contact with and on the semiconductor layer.

20. The method for producing the Group III nitride semiconductor light-emitting device according to claim 19, wherein the semiconductor layer is grown at a temperature of 800 degree C. or less, and a concave and convex structure is formed on a surface on a transparent electrode side of the semiconductor layer.

\* \* \* \* \*